US010666306B1

(12) United States Patent
Yoo et al.

(10) Patent No.: US 10,666,306 B1
(45) Date of Patent: May 26, 2020

(54) PHASE LINEARITY ENHANCEMENT TECHNIQUES FOR DIGITAL WIRELESS TRANSMITTERS AND DIGITAL POWER AMPLIFIERS

(71) Applicant: Board of Trustees of Michigan State University, East Lansing, MI (US)

(72) Inventors: Sangmin Yoo, Okemos, MI (US); Si-Wook Yoo, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 16/683,690

(22) Filed: Nov. 14, 2019

Related U.S. Application Data

(60) Provisional application No. 62/760,992, filed on Nov. 14, 2018.

(51) Int. Cl.
*H04B 1/04* (2006.01)
*H03F 3/21* (2006.01)
*H03F 1/32* (2006.01)
*H04L 27/04* (2006.01)
*H04B 1/00* (2006.01)

(52) U.S. Cl.
CPC ............ *H04B 1/0475* (2013.01); *H03F 1/32* (2013.01); *H03F 3/211* (2013.01); *H04B 1/0007* (2013.01); *H04L 27/04* (2013.01); *H03F 2200/451* (2013.01); *H03F 2201/3215* (2013.01); *H03F 2203/21106* (2013.01); *H03F 2203/21139* (2013.01); *H03F 2203/21142* (2013.01); *H04B 2001/0408* (2013.01)

(58) Field of Classification Search
CPC ....... H04B 1/0475; H04B 1/0007; H03F 1/32; H03F 3/211; H04L 27/04
See application file for complete search history.

(56) References Cited

U.S. PATENT DOCUMENTS

| | | | |
|---|---|---|---|
| 2012/0106402 A1* | 5/2012 | Morimoto | H03F 1/0266 370/278 |
| 2020/0007116 A1* | 1/2020 | Agrawal | H03K 7/06 |

OTHER PUBLICATIONS

Sang-Min Yoo, et al., A Switched-Capacitor RF Power Amplifier, IEEE Journal of Solid-State Circuits, vol. 46 No. 12, Dec. 2011.
Debopriyo Chowdhury, et al., A Fully-Integrated Efficient CMOS Inverse Class-D Power Amplifier for Digital Polar Transmitters, IEEE Journal of Solid-State Circuits, vol. 47 No. 5, May 2012.
Song Hu, et al., A Broadband Mixed-Signal Cmos Power Amplifier With a Hybrid Class-G Doherty Efficiency Enhancement Technique, IEEE Journal of Solid-State Circuits, vol. 51 No. 3, Mar. 2016.

* cited by examiner

*Primary Examiner* — Nguyen T Vo
(74) *Attorney, Agent, or Firm* — Harness, Dickey & Pierce, PLC

(57) ABSTRACT

A technique is presented for correcting phase distortion in a digital wireless transmitter. The technique includes: receiving an RF signal in an analog domain by a digital-to-RF modulator; amplitude modulating, the RF signal in accordance with a digital input code; and introducing delay in a signal path traversed by the RF signal before the digital-to-RF modulator using a delay circuit. The duration of the delay depends upon the value of the digital input code and substantially cancels out the phase distortion introduced by the digital wireless transmitter.

20 Claims, 12 Drawing Sheets

PHASE LINEARITY ENHANCEMENT TECHNIQUES FOR DIGITAL WIRELESS TRANSMITTERS AND DIGITAL POWER AMPLIFIERS

CROSS-REFERENCE TO RELATED APPLICATIONS

This application claims the benefit of U.S. Provisional Application No. 62/760,992, filed on Nov. 14, 2018.

FIELD

The present disclosure relates to built-in phase linearity enhancement techniques for digital wireless transmitters, RF DAC, digital-to-RF modulator, and digital power amplifiers.

BACKGROUND

Digital transmitters and digital power amplifiers have been an active area of research these days with the advance of CMOS technology. Energy-efficient small transmitter is critical for many applications that employs MIMO, multi-band, and multi-standard transceivers because of multiple transmitters being adopted in a single chip or system. Each conventional transmitter consists of baseband digital-to-analog converter (DAC), filter, upconversion mixer, and driving/power amplifier, and occupies a large area and consumes static current in its amplifiers when outputting even a small power. For instance, a mobile system for multi-band, MIMO radio that supports multiple standards, such as Wi-Fi, Bluetooth, and cellular, consumes a very large chip area and high power with many analog/RF blocks that draw very high current. Digital transmitters integrate all block in a transmitter chain in a single block that directly generates modulated RF signal without any high static current. On the other hand, a very linear transmitter with excellent EVM and wide bandwidth is also desired to support a very high data throughput in modern wireless standards such as 5G or 802.11ax.

This disclosure presents linearity enhancement techniques related to phase distortion for digital wireless transmitters, digital power amplifiers, RF digital-to-analog converters (RF DAC), and/or digital-to-RF converters.

This section provides background information related to the present disclosure which is not necessarily prior art.

SUMMARY

This section provides a general summary of the disclosure, and is not a comprehensive disclosure of its full scope or all of its features.

A technique is presented for correcting phase distortion in a digital wireless transmitter. The technique includes: receiving an RF signal in an analog domain by a digital-to-RF modulator; amplitude modulating, the RF signal in accordance with a digital input code; and introducing delay in a signal path traversed by the RF signal before the digital-to-RF modulator using a delay circuit. The duration of the delay depends upon the value of the digital input code and substantially cancels out the phase distortion introduced by the digital wireless transmitter.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

In one aspect of this disclosure, a method is presented for correcting phase distortion in a digital wireless transmitter. Digital power amplifiers (DPA), digital transmitters, RF DACs, and digital-to RF converters based on switched-capacitor power amplification (SCPA) show a very good efficiency and linearity with ideal switches and good capacitor matching. Additionally, SCPA-based DPA demonstrates an excellent linearity when the switch resistance is low and rise/fall time is very fast. RF DAC is expected to generate output signal with modulated amplitude according to the digital input code and with phase that reflects the RF input signal. However, non-ideal switches with finite impedance that change dynamically according to the input code could cause non-linear amplitude (AM-AM) and phase (AM-PM) distortion.

Phase distortion (AM-PM distortion) for different types of switched-capacitor power amplification is shown in FIGS. 1A-1D. For SCPA, the phase distortion changes linearly with amplitude. The phase distortions are also seen as more dominant in the first order and weaker in the higher orders. As a result, the phase distortion is changing gradually with changes in the input code. This disclosure proposes correcting for the distortion by measuring the distortion during a calibration procedure and correcting for distortion introduced by the switched-capacitor power amplification, RF DAC or switched-capacitor digital to RF signal conversion circuits by employing (a) delay cell(s) in the RF input path.

Figure 1A:
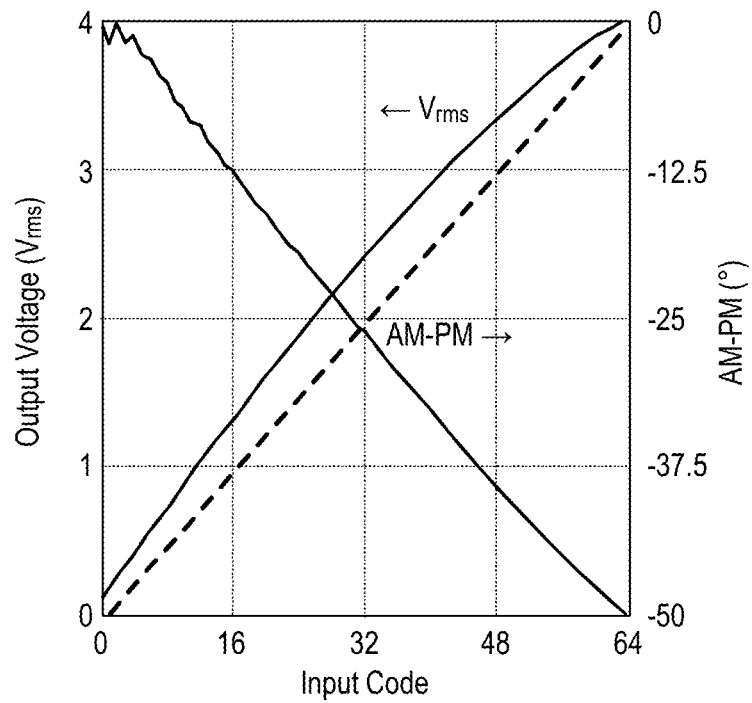
FIGS. 1A-1D are graphs illustrating phase distortion for different types of switched-capacitor power amplification or switched-capacitor RF DAC in the system architectures, such as polar, polar class-G, quadrature, and quadrature class-G, respectively.
Figure 1B:
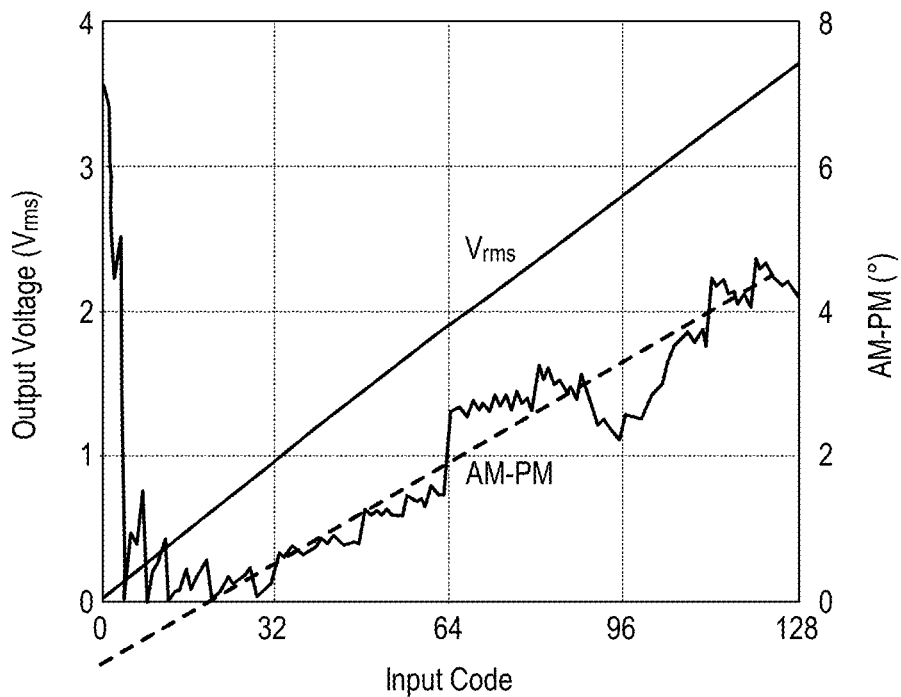
Figure 1C:
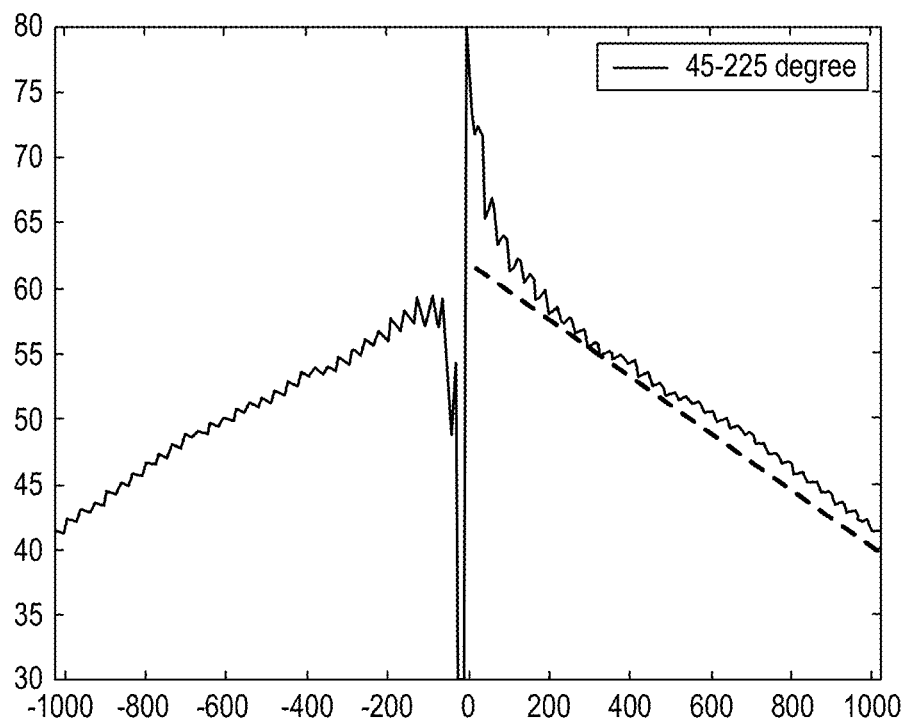
Figure 1D:
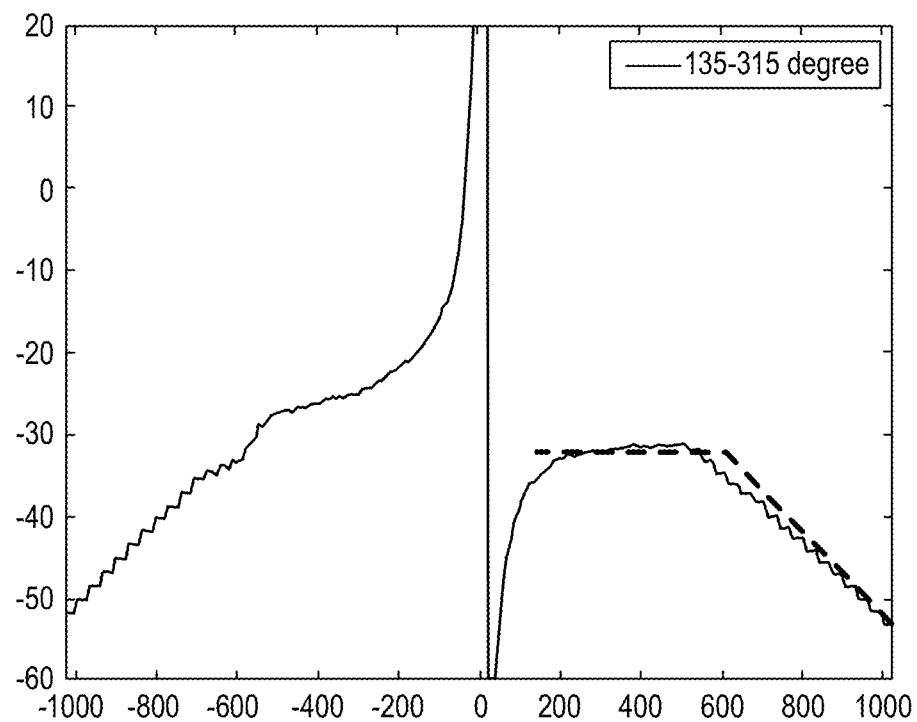
Figure 2A:
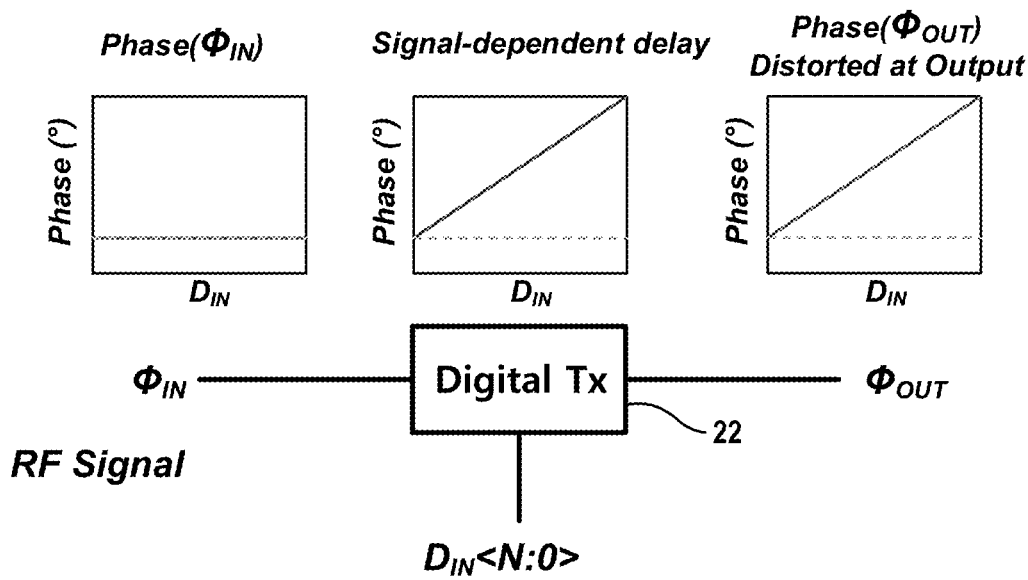
FIG. 2A is a diagram depicting phase distortion in a digital transmitter.

FIG. 2A further illustrates phase distortion for a digital transmitter 22. During a calibration process, the amount of phase distortion can be measured. For example, the amount of phase distortion, or signal dependent delay, can be measured for two or more input codes. Given the linear relationship, the slope for the phase distortion can be computed from the two or more measurements. For a given digital input code, the amount of phase distortion can then be determined using the computed slope. Once the amount of phase distortion is determined, correction can be performed by applying an inverse amount of phase distortion to the RF input signal such as carrier signal, quadrature signal, phase modulated signal, or any RF signal with any phase used for the input of the RF digital transmitter as will be further described below. Other techniques for determining the amount of phase distortion also fall within the scope of this disclosure.

Figure 2B:
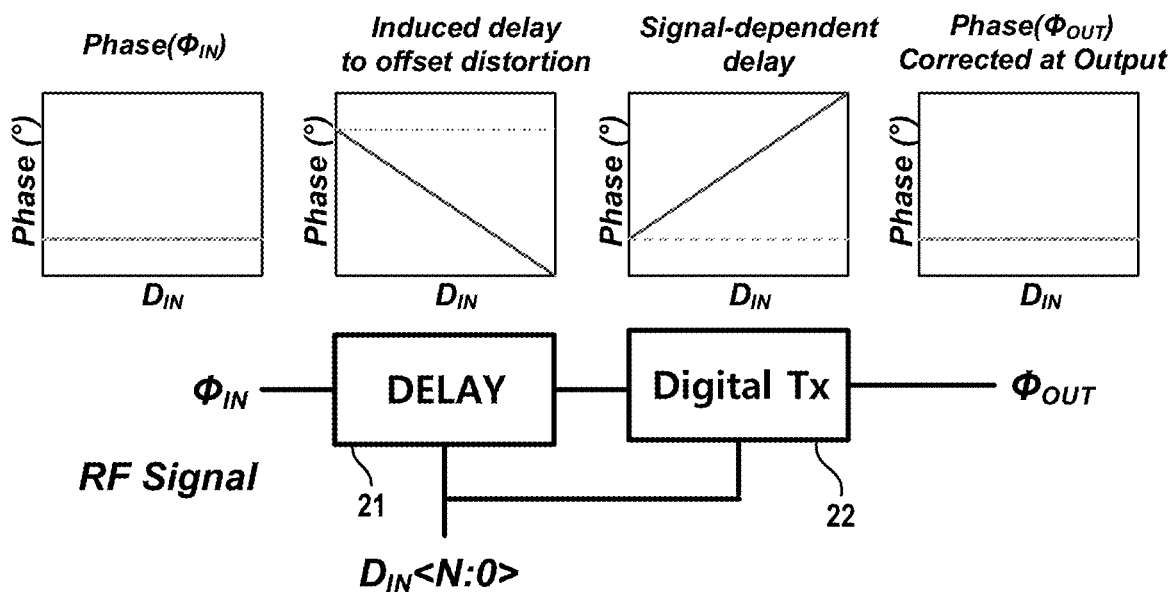
FIG. 2B is a diagram depicting a technique for correction phase distortion with induced delay of the RF signal in the analog domain.

With reference to FIG. 2B, one or more delay cells with the inverse property of the measured phase distortion can be added to the signal path. In this example, an RF input signal is received in the analog or RF domain and subsequently amplitude modulated by a modulator of the digital wireless transmitter in accordance with a particular digital input code. In some embodiments, the modulator is further defined as a digital-to-RF modulator although other types of modulators may fall within the broader aspects of this disclosure. In the analog or RF domain, a delay is introduced by a delay circuit 21. The delay circuit is disposed in the signal path traversed by the RF input signal in or before the modulator. The duration of the delay depends upon the value of the particular digital input code and substantially cancels out the phase distortion introduced by the digital wireless transmitter 22 as seen in FIG. 2B. In this way, the phase distortion introduced by the digital wireless transmitter 22 can be corrected on chip without any additional complex signal processing, such as digital predistortion (DPD). It is noted that the delay could have different polarity as well as different slope. For example, the delay can have the maximum value at lowest codes or the largest codes. The polarity of the delay change can be addressed accordingly by changing the way to control the delay cell.

A controller (not shown) is interfaced with the modulator circuit and the delay circuit. During operation, the modulator circuit amplitude modulates the RF signal in accordance with the digital input code received from the controller and the controller adjusts to the delay introduced by the delay circuit in accordance with the digital input code. In an exemplary embodiment, the controller is implemented as a microcontroller. It should be understood that the logic for the control of digital wireless transmitter by controller 15 can be implemented in hardware logic, software logic, or a combination of hardware and software logic. In this regard, controller can be or can include any of a digital signal processor (DSP), microprocessor, microcontroller, or other programmable device which are programmed with software implementing the above described methods. It should be understood that alternatively the controller is or includes other logic devices, such as a Field Programmable Gate Array (FPGA), a complex programmable logic device (CPLD), or application specific integrated circuit (ASIC). When it is stated that controller performs a function or is configured to perform a function, it should be understood that controller is configured to do so with appropriate logic (such as in software, logic devices, or a combination thereof).

Figure 2C:
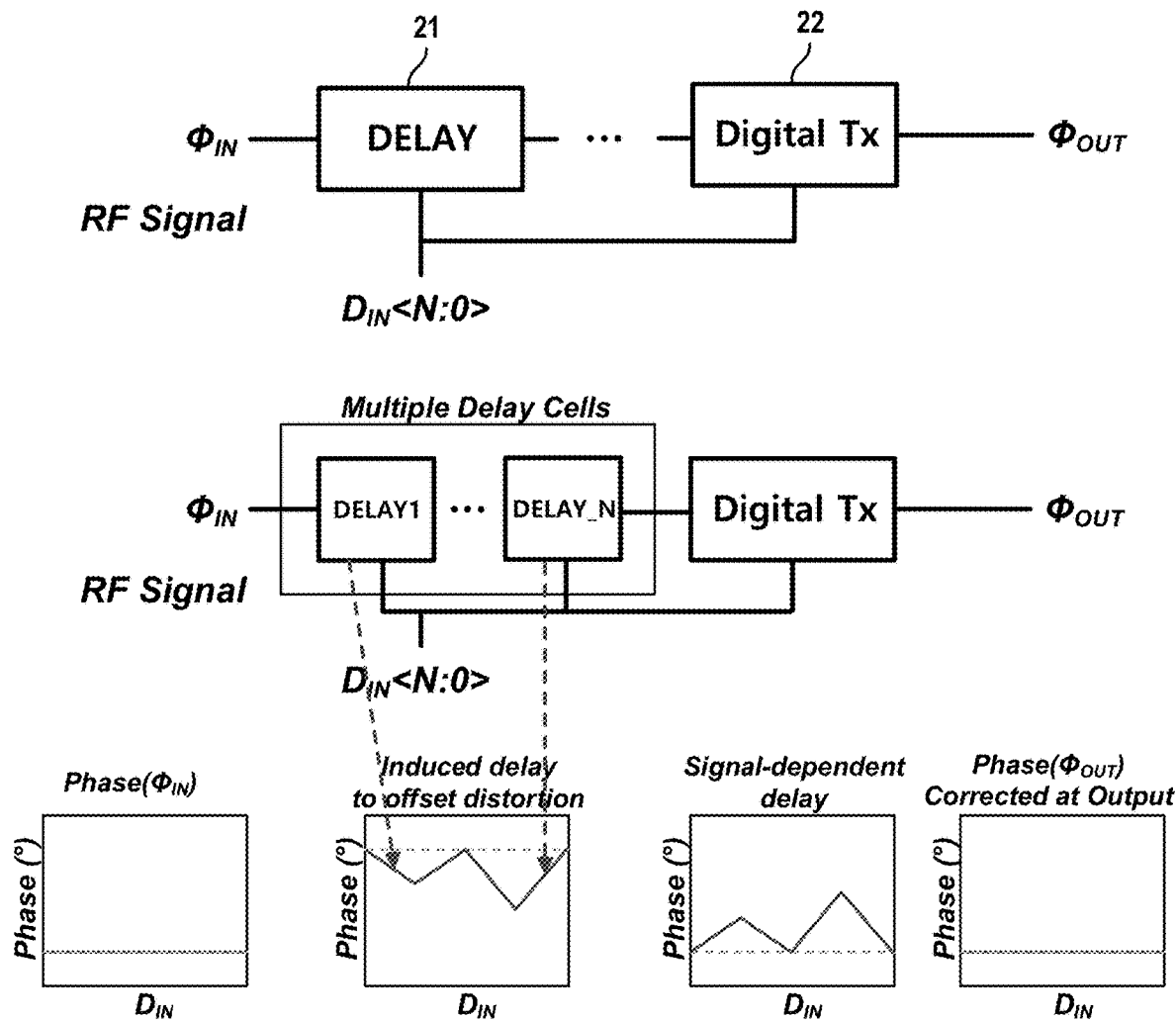
FIG. 2C is a diagram depicting a technique for correction phase distortion using multiple delay cells.

In some instances, phase distortion can have more complex shapes. Referring to FIG. 2C, multiple delay cells can be used to cancel out multi-segment distortion. Distortion with multiple segments can be seen in Class-G operation with different supply voltages, Doherty, power combining, and so on. The phase distortion is segmented into multiple segments and a different delay component is implemented for each segment of phase distortion. That is, each segment can have different slope and polarity. The order of the delay cells is not important and can be assigned randomly.

Figure 3A:
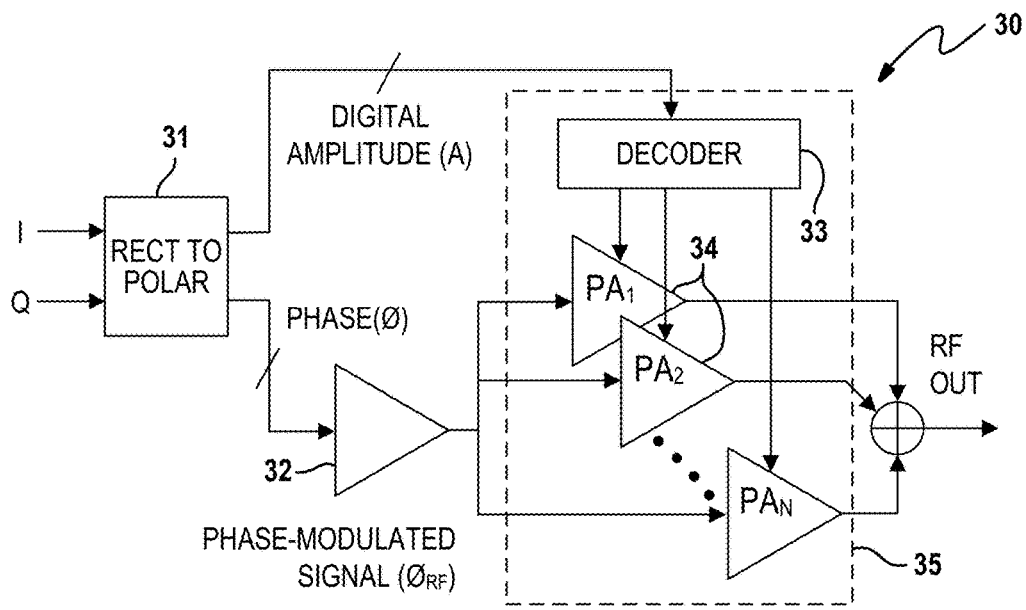
FIGS. 3A and 3B are block diagrams example embodiments of a digital wireless transmitters with polar architectures.
Figure 3B:
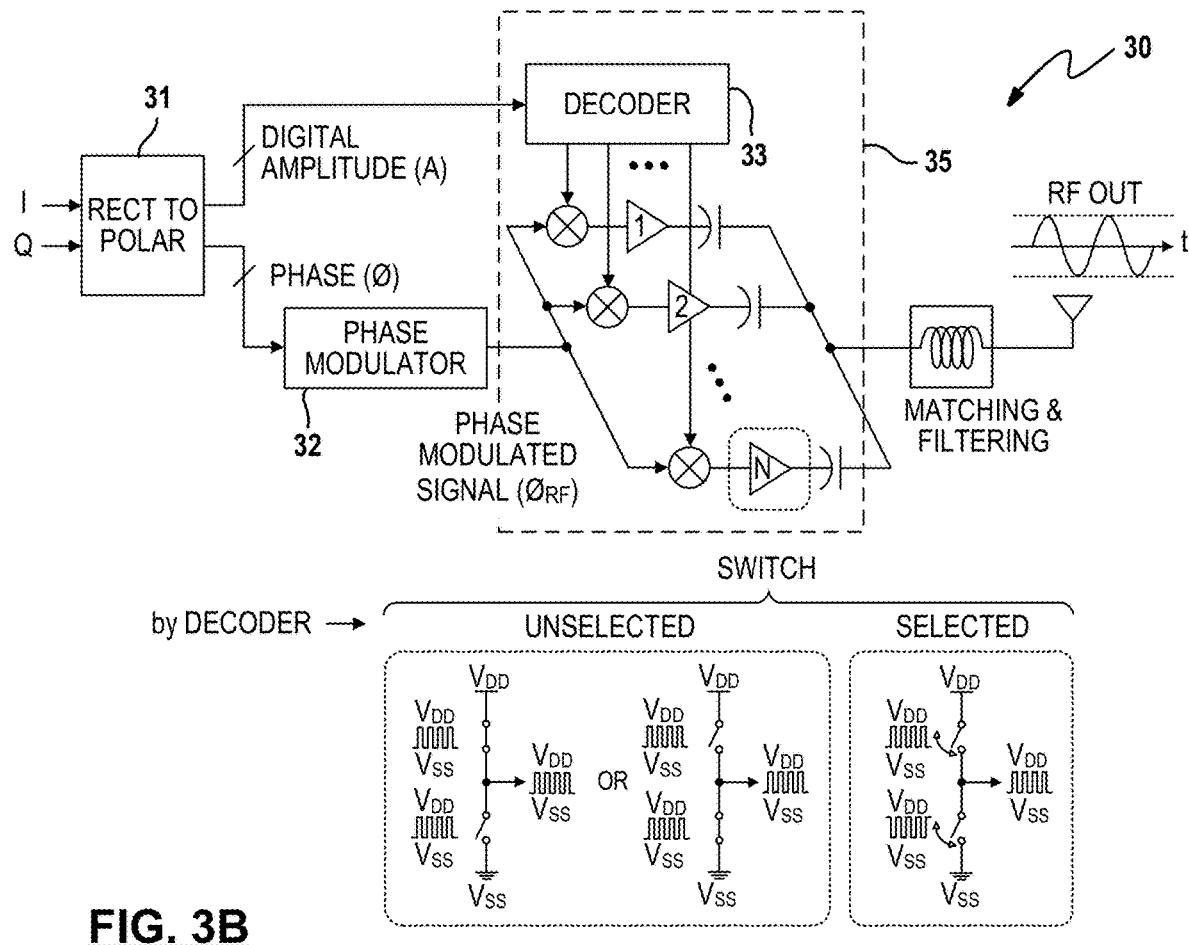

FIG. 3A depicts an example embodiment of a digital wireless transmitter 30 with a polar modulation architecture. The digital wireless transmitter 30 is comprised of a rectangular-to-polar converter, a Cartesian-to-polar converter or a Coordinate Rotation Digital Computer (CORDIC) 31, a phase modulator 32, and an RF DAC 35 that consists of a series of unit cells 34 and one or more decoders 33. Of note, the unit cells or unit power amplifiers can be switches, inverters or any switching power amplifiers (e.g., Class-D). Another example of a digital wireless transmitter 30 with a polar modulation architecture is shown in FIG. 3B. In this example, the RF DAC employs a switched capacitor circuit or SCPA technique. The phase distortion correction technique described herein can also be implemented in either embodiment.

In these two example embodiments, the quadrature carrier signals for an RF input are received by the rectangular-to-polar or Cartesian-to-polar converter 31. The quadrature carrier signals are in turn converted to polar signals by the rectangular-to-polar converter 31. The phase component is converted from the digital domain to the analog domain by a phase modulator 32 and serves as an input to the RF DAC 35. The RF DAC 35 combines digital-to-analog conversion with up-conversion mixing, and generates an RF output signal that changes its amplitude with the digital input code. The decoder 33 switches a discrete number of the power amplifiers (or unit cells) in the signal path to have a changing amplitude with modulated phase component of the polar signals. The phase of the RF signal is determined by the input phase to the RF DAC as discussed earlier. While particular architectures are described, it is readily understood that the technique for correcting phase distortion is applicable to other types architectures as described below.

Figure 4:
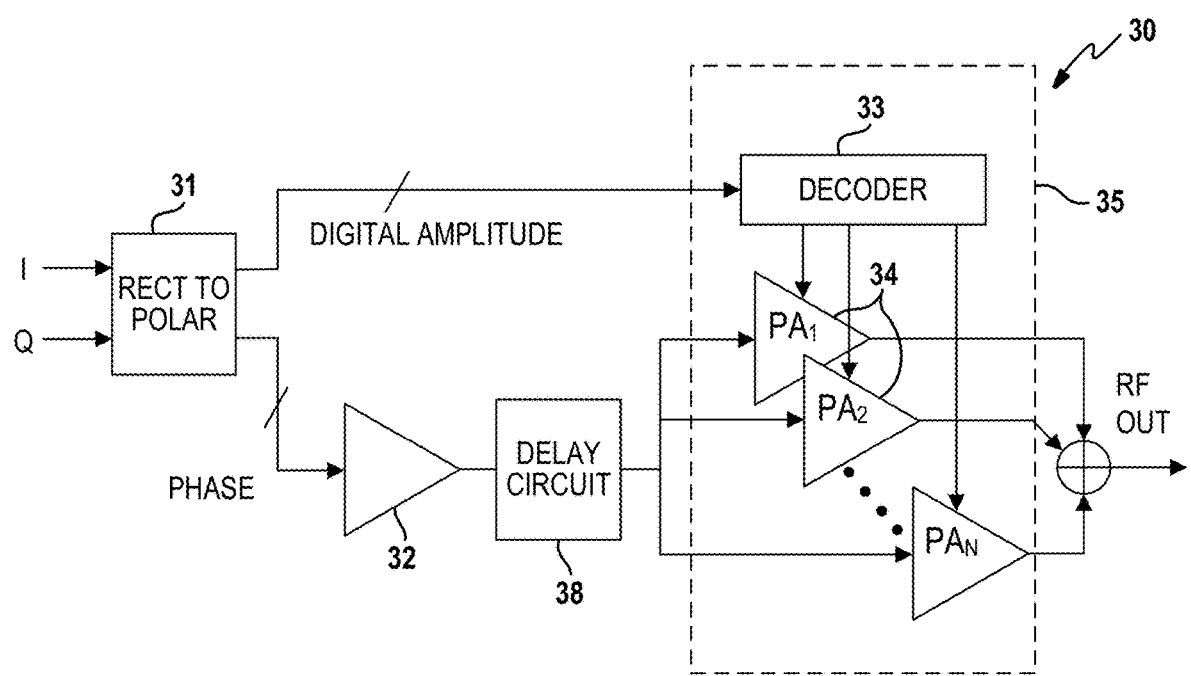
FIG. 4 is a block diagram of the example embodiment of the digital wireless transmitter in FIG. 3A modified to include a delay circuit.

FIG. 4 illustrates how the digital wireless transmitter 30 can be modified to enable the technique for correcting phase distortion. In this example, the delay circuit 38 is injected anywhere into the signal path between the phase modulator 32 and the RF DAC 35. There could also be buffers or other circuits in the signal path. The delay circuit 38 is preferably disposed before the RF DAC 35 because the phase signal before the RF DAC has a constant amplitude. Introducing delay in the analog domain at other locations along the signal path are also contemplated by this disclosure.

Delay cells can be implemented with any circuits that introduce variable delay into a pulse, a sinusoidal wave, pulse-width modulated (PWM) or another type of signal, where the delay time depends upon the value of the input code. The delay cells can be a combination of multiple circuit structures that could increase or decrease the delay, including but not limited to: capacitors, inverters, buffers, resistors, inverters with current bias, current-starved delay elements and so on. Non-limiting examples are shown in FIGS. 5A-5F.

Figure 5A:
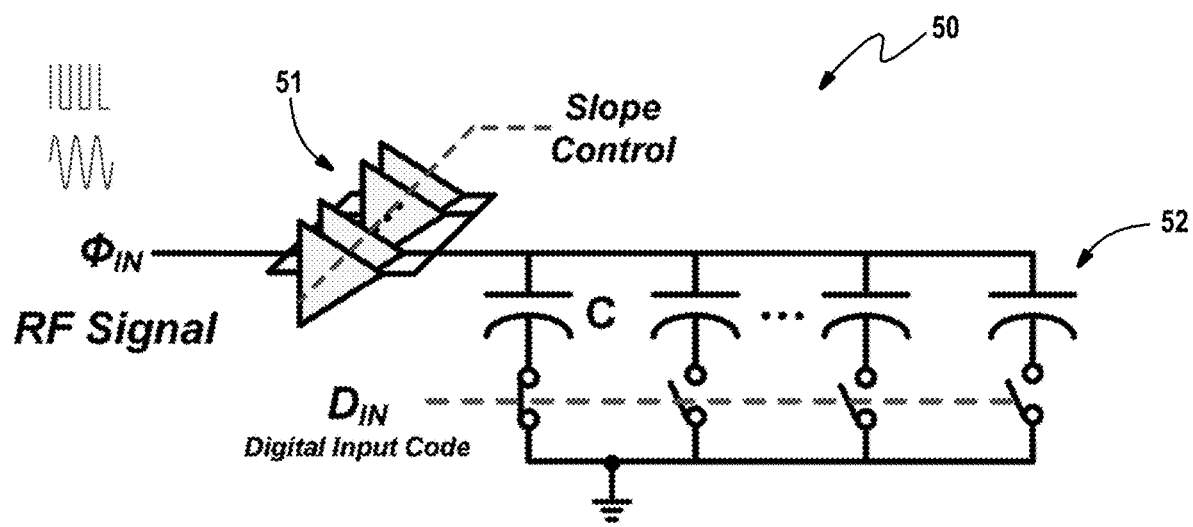
FIG. 5A-5F are schematics illustrating different example embodiments for a delay circuit.

In FIG. 5A, the delay circuit 50 is comprised of a combination of buffers 51 and capacitors 52. One of the buffer strength or number of buffers can be used to change the slope of phase correction; whereas, the number of capacitors can be used to compensate for the input-code dependent phase (delay) change. The digital input code is an input to the delay circuit 50. Digital input code could be a binary code, a unary code, or any other codes. More specifically, the digital input code is input to a controller (not shown) which is interfaced with each of the switches electrically coupled between the capacitors and ground. The controller controls the switches to change the delay and compensate for the phase distortion associated with the digital input code.

Figure 5B:
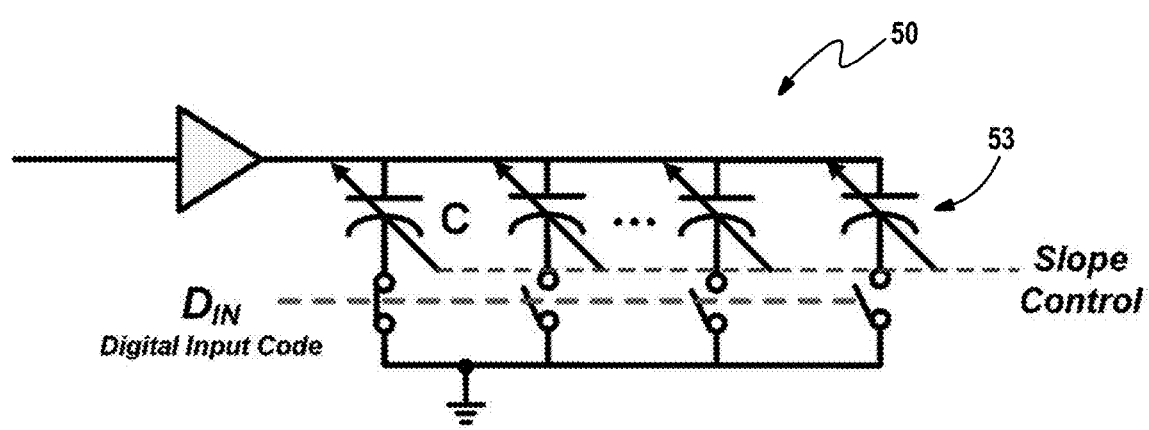

In FIG. 5B, the delay circuit 50 is comprised of multiple varactors 53. In this example, varactor voltage can be used to adjust the slope of phase correction, and the number of varactors can be used to compensate for the input-code dependent phase (delay) change. Again, the digital input code is an input to a controller and the controller controls the switches to change the delay and compensate for the phase distortion associated with the digital input code.

Figure 5C:
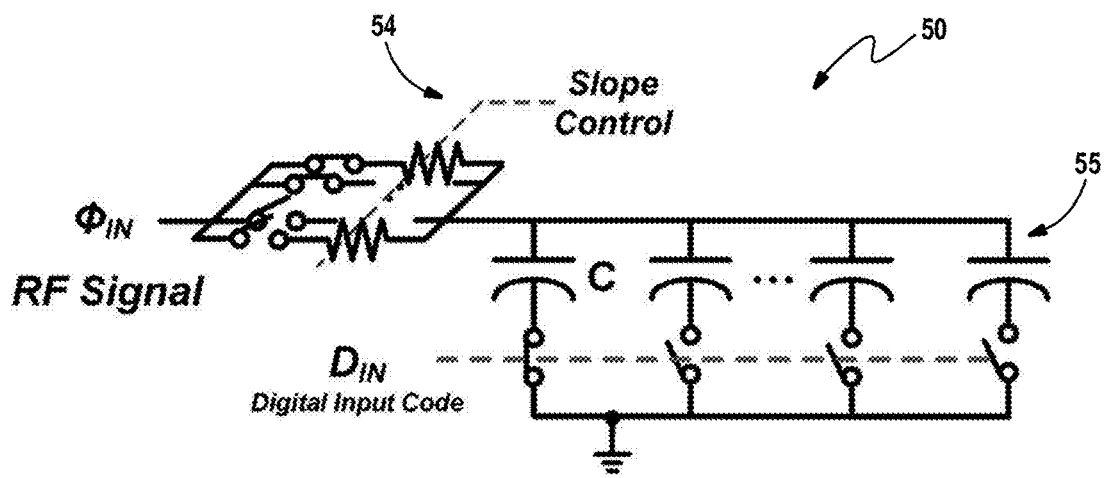

In FIG. 5C, the delay circuit 50 is comprised of a combination of resistors 54 and capacitors 55. In this example, resistors can be controlled to change the slope of phase correction, and the number of capacitors can be used to compensate for the input-code dependent phase (delay) change. Again, the digital input code is an input to a controller and the controller controls the switches to change the delay and compensate for the phase distortion associated with the digital input code.

Figure 5D:
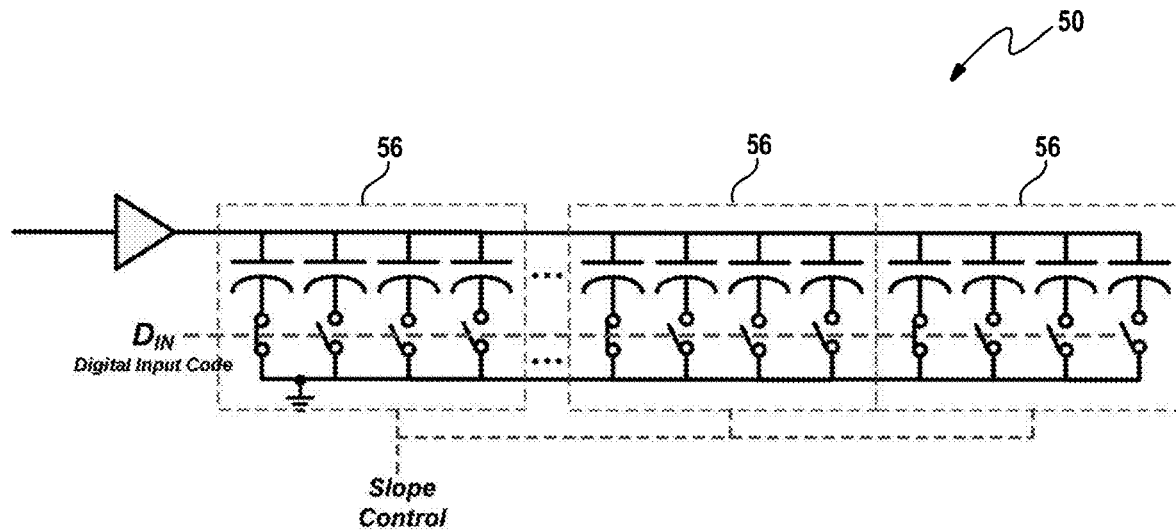

In FIG. 5D, the delay circuit 50 is comprised of multiple capacitor banks 56. Each capacitor bank 56 includes a plurality of capacitors arranged in parallel and a switch electrically coupled between each capacitor and ground or between each capacitor and the buffer or inverter output. Multiple capacitors in a single capacitor bank can be used to adjust the slope of phase correction, and the number of capacitor banks can be used to compensate for the input-code dependent phase (delay) change. The digital input code is an input to a controller and the controller controls the switches to change the delay and compensate for the phase distortion associated with the digital input code.

Figure 5E:
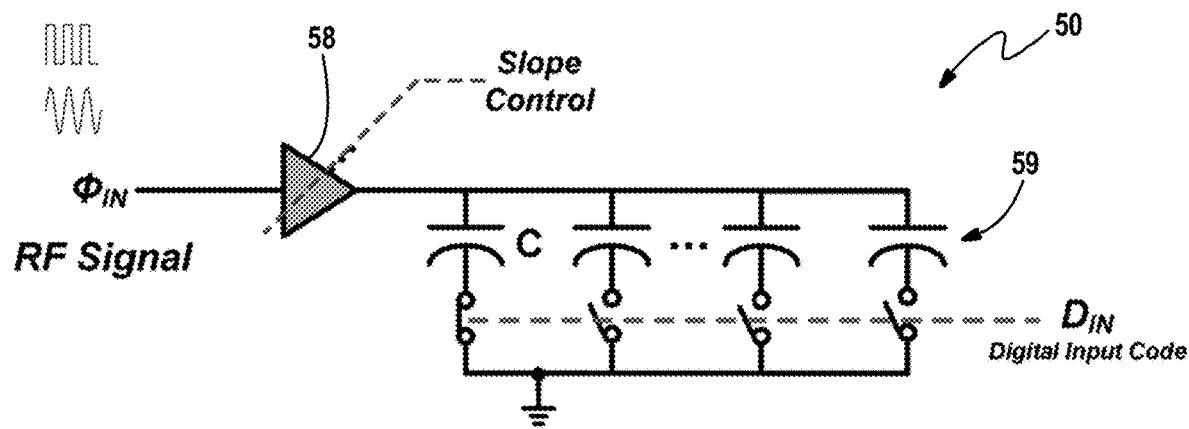
Figure 5F:
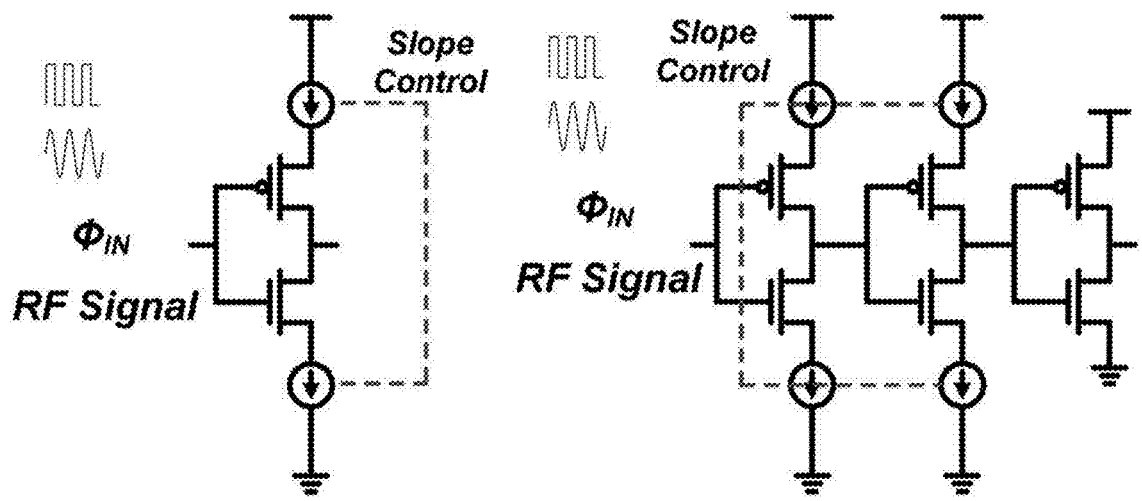

In FIG. 5E, delay circuit 50 is comprised of a delay element 58 and a number of capacitors 59. The delay element 58 changes delay according to a control signal. An example delay element 58 can be one or more inverters that are controlled with a current source as seen in FIG. 5F. In this example, the slope of the delay is controlled with different amounts of current; whereas, the number of capacitors can be used to compensate for the input-code dependent phase (delay) change. In this case, the digital input code is an input to a controller and the controller controls the current sources and thereby compensates for the phase distortion associated with the digital input code.

In the examples discussed here, the switches that connect capacitor to AC ground such as VDD or ground are located between the capacitors and the AC ground. However, it can also be connected to the other side of capacitors as long as it can control the capacitance. Also, it is noted that the control for the slope control code and digital input code that changes input-code dependent delay can be swapped in all the examples shown here.

While a few example embodiments of a delay circuit have been described above, it is readily understood that other implementations for a delay circuit also fall within the broader aspects of this disclosure. In these examples, the input code is applied to the different delay cells that changes time or phase delay accordingly. In these examples, the controller can be implemented as a simple digital circuit such as binary-to-thermometer decoder depending on the format of input digital code. The delay cell can also add or reduce time delay linearly or in a logarithmic manner. It does not require any complex digital computation because the input digital code directly changes the delay. The control logic can be very simple and often integrated with RF DAC on the same chip.

Figure 6A:
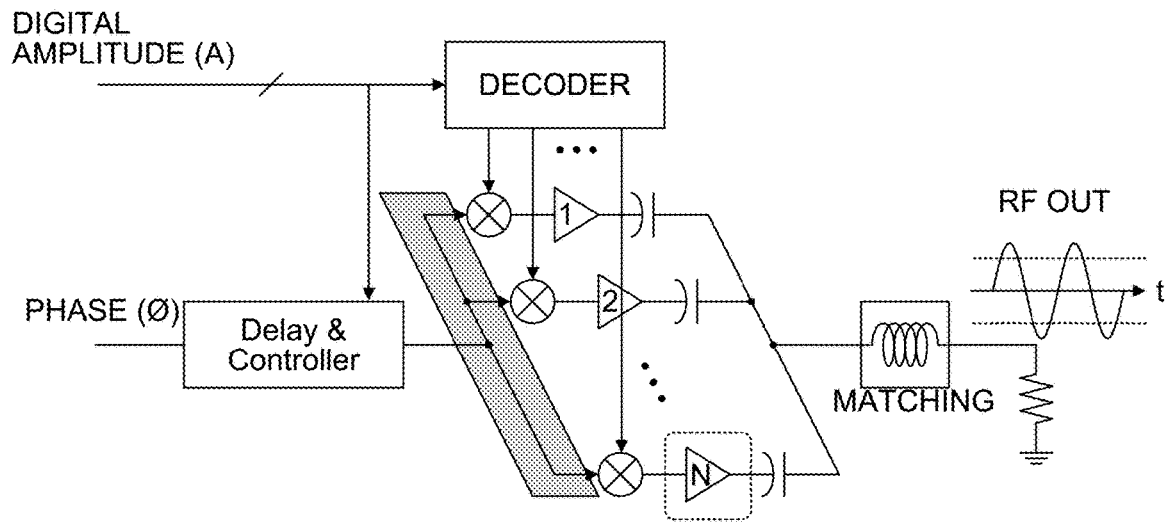
FIGS. 6A-6D are block diagrams illustrating how the phase distortion correction technique can be extended to other architectures for a digital wireless transmitter.

FIGS. 6A-6D illustrate how the phase distortion correction technique described above can be extended to other architectures for a digital wireless transmitter. FIG. 6A is an architecture configured to receive an RF signal with one amplitude component and one phase component. This is the general case for a polar architecture but could also extend to other architectures with a single phase component as well.

Figure 6B:
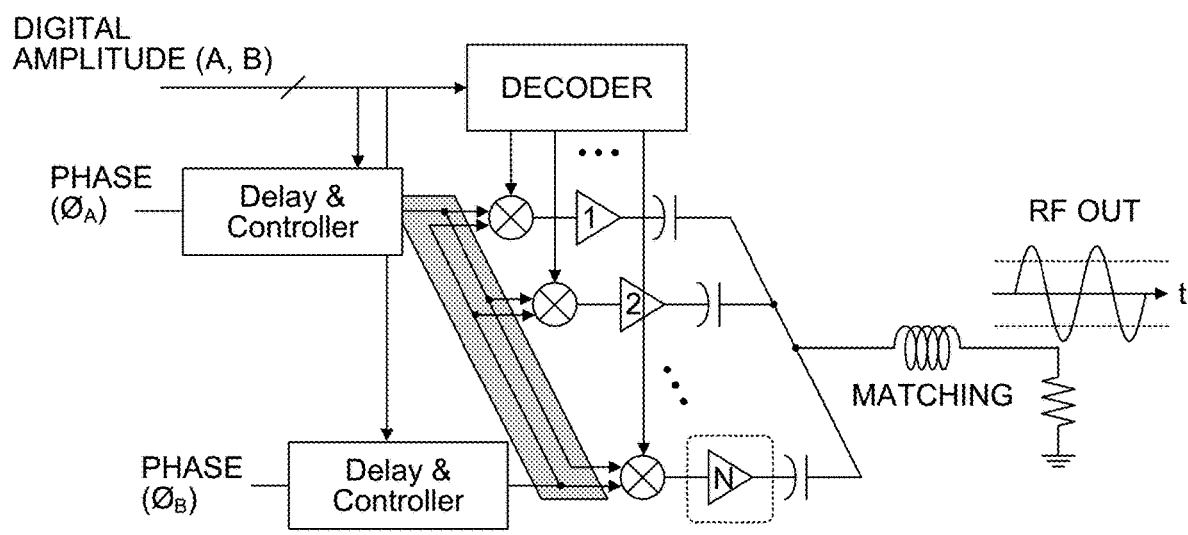

FIG. 6B is an architecture configured to receive an RF signal with two or more amplitude components and two or more phase components. Quadrature modulation is one example of such an RF signal. Another arrangement for receiving an RF signal with two or more amplitude components and two or more phase components is shown in FIG. 6D.

Figure 6C:
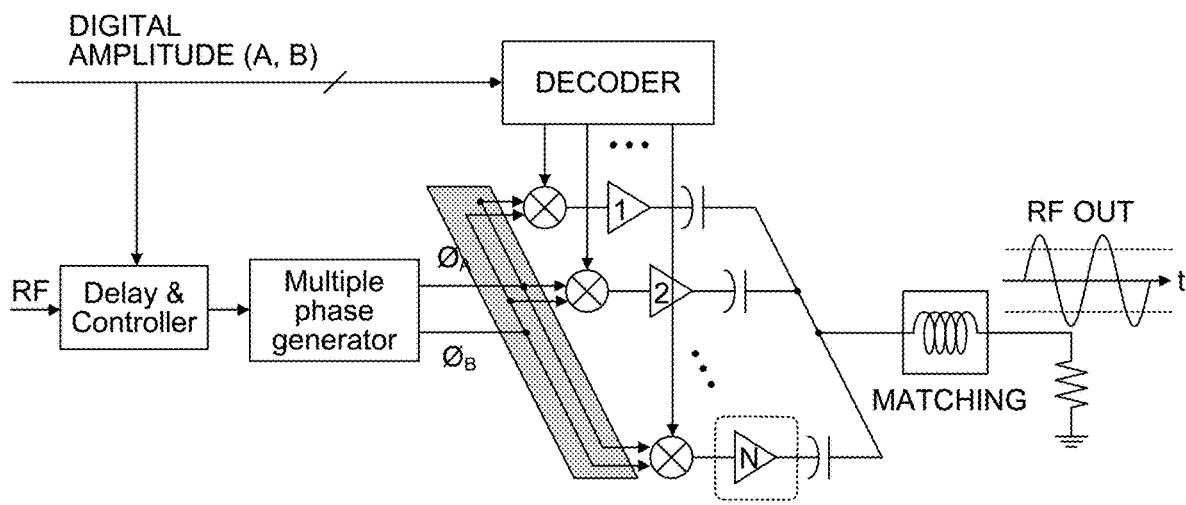
Figure 6D:
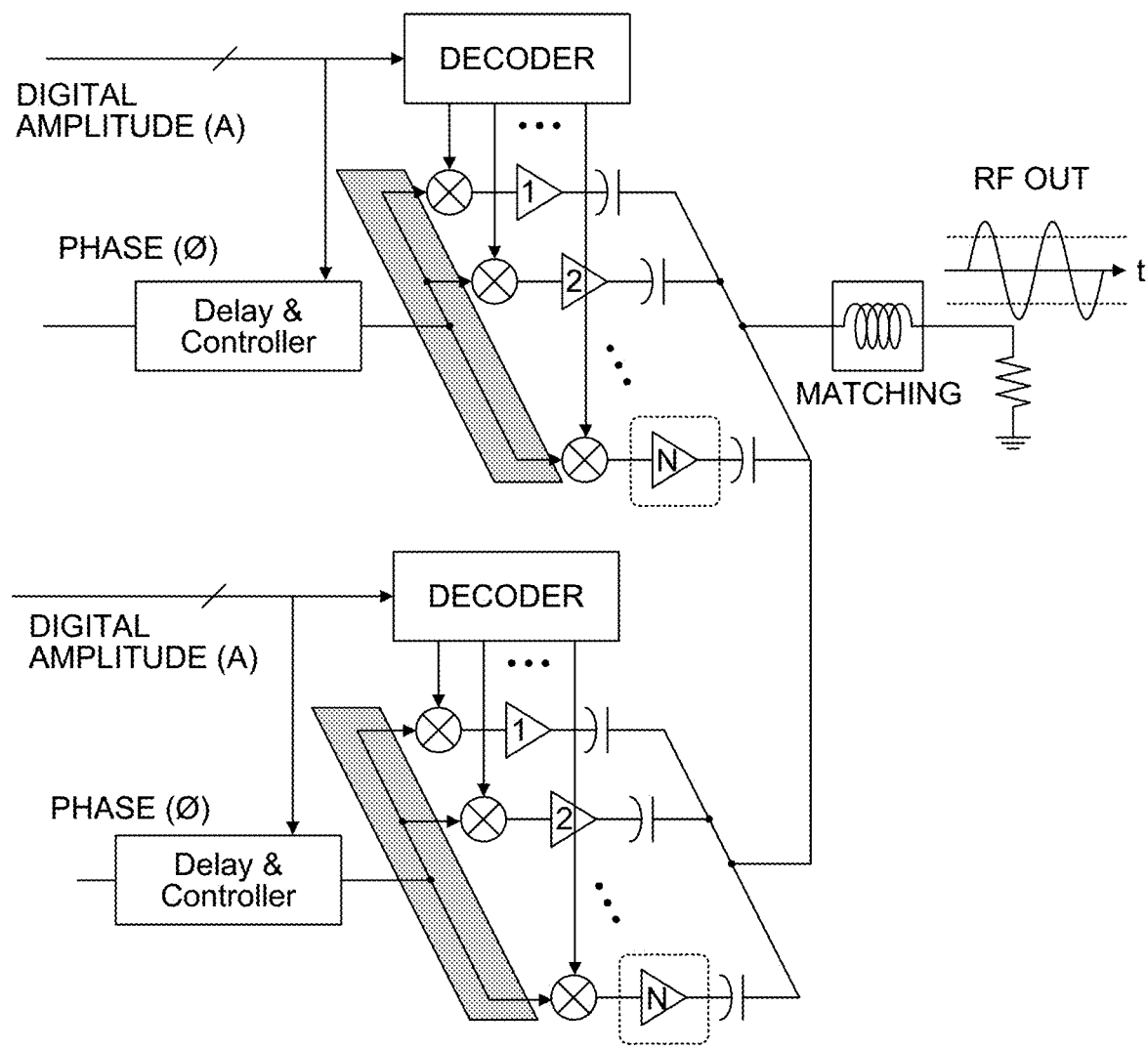

FIG. 6C is an architecture configured to receive an RF signal with two or more amplitude components but only one phase component. This architecture would apply to a case where two or more phase components are generated from one phase component by a multiple phase generator. This architecture is commonly referred to as a quadrature architecture, multiphase architecture or outphasing architecture. These variant are merely intended to be illustrative. Extending the phase distortion correction technique described herein to other types of architecture also falls within the broader aspects of this disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for correcting phase distortion in a digital wireless transmitter, comprising:
   receiving, by a digital-to-RF modulator, an RF signal in an analog domain;
   amplitude modulating, by the digital-to-RF modulator, the RF signal in accordance with a digital input code;
   introducing, by a delay circuit in the analog domain, delay in a signal path traversed by the RF signal before the digital-to-RF modulator, where the duration of the delay depends upon the value of the digital input code and substantially cancels out the phase distortion introduced in the digital wireless transmitter.

2. The method of claim 1 further comprises determining an amount of phase distortion introduced into a modulated signal output by the digital transmitter, where the amount of phase distortion varies continuously with value of the digital input code.

3. The method of claim 2 further comprises determining an amount of phase distortion for at least two modulated signals and computing a slope for the phase distortion from the amount of phase distortion determined from the at least two modulated signals, where the at least two modulated signals are each modulated with different digital input codes.

4. The method of claim 2 further comprises determining an amount of phase distortion for a plurality of modulated signals, where each modulated signal in the plurality of modulated signal is modulated with a different digital input code selected from a set of possible digital input codes.

5. The method of claim 1 further comprises determining the phase distortion introduced into a modulated signal output in the digital transmitter; segmenting the phase distortion in multiple segments; and implementing a different delay component for each segment of phase distortion, where the delay circuit includes a delay component for each segment of phase distortion.

6. The method of claim 1 further comprises receiving, by a controller, value for the digital input code, and adjusting delay introduced by the delay circuit in accordance with the value for the digital input code.

7. The method of claim 1 further comprises arranging the delay circuit in a signal path traversed by phase component of the RF signal, where the RF signal includes only one phase component.

8. The method of claim 1 further comprises arranging a delay circuit in a signal path traversed by each phase component of the RF signal, where the RF signal includes two or more phase components.

9. A digital wireless transmitter, comprising:
a digital-to-RF modulator configured to receive the RF signal and amplitude modulate the RF signal in an analog domain in accordance with a digital input code; and
a delay circuit disposed before the digital-to-RF modulator, wherein the digital-to-RF modulator is configured to receive the RF signal and introduce a delay in the RF signal such that duration of the delay introduced by the delay circuit depends upon the value of the digital input code and substantially cancels out phase distortion introduced by the digital-to-RF modulator in the digital transmitter.

10. The digital wireless controller of claim 9 further includes a controller interfaced with the digital-to-RF modulator and the delay circuit, wherein the modulator circuit amplitude modulates the RF signal in accordance with the digital input code received from the controller, and the controller adjusts to the delay introduced by the delay circuit in accordance with the digital input code.

11. The digital wireless transmitter of claim 9 implements modulation of the RF signal such that the delay circuit is arranged in a signal path traversed by a phase component of the RF signal.

12. The digital wireless transmitter of claim 9 further comprises arranging a delay circuit in a signal path traversed by each phase component of the RF signal, where the RF signal includes two or more phase components.

13. The digital wireless transmitter of claim 9 further comprises a plurality of delay circuits in parallel before the digital-to-RF modulator, such that the duration of delay introduced by each of the plurality of delay circuits differs.

14. The digital wireless transmitter of claim 9 further comprises a plurality of delay circuits in series or in parallel before the digital-to-RF modulator, such that phase distortion introduced in the digital transmitter is segmented into multiple segments and each delay circuit in the plurality of delay circuit corresponds to a different segment of phase distortion introduced in the digital transmitter.

15. The digital wireless transmitter of claim 9 wherein the delay circuit includes a buffer in series with a capacitor bank and a controller interfaced with the capacitor bank, wherein the capacitor bank includes a plurality of capacitors arranged in parallel, and a switch electrically coupled to each capacitor in the plurality of capacitors, such that switches are controlled by the controller.

16. A digital wireless transmitter, comprising:
a rectangular-to-polar converter circuit configured to receive an RF carrier signal;
a phase modulator circuit configured to receive a phase component of the RF carrier signal from the rectangular-to-polar converter circuit;
a RF digital-to-analog converter circuit configured to receive an amplitude component of the RF carrier signal from the rectangular-to-polar converter circuit and the modulated phase component of the RF carrier signal from the phase modulator circuit, wherein the RF digital-to-analog converter circuit operates to amplitude modulate RF carrier signal in accordance with a particular digital input code; and
a delay circuit disposed along a signal path before the RF digital-to-analog converter circuit, where duration of the delay introduced by the delay circuit depends upon the value of the particular digital input code and substantially cancels out phase distortion introduced in the digital transmitter.

17. The digital wireless transmitter of claim 16 wherein the RF digital-to-analog converter circuit further includes a decoder and a series of power amplifiers.

18. The digital wireless transmitter of claim 16 further includes a controller interfaced with the RF digital-to-analog converter circuit and the delay circuit, wherein the RF digital-to-analog converter circuit amplitude modulates the RF carrier signal in accordance with the particular digital input code received from the controller and the controller adjusts to the delay introduced by the delay circuit in accordance with the particular digital input code.

19. The digital wireless transmitter of claim 16 wherein the delay circuit includes a buffer in series with a capacitor bank and a controller interfaced with the capacitor bank, wherein the capacitor bank includes a plurality of capacitors arranged in parallel, and a switch electrically coupled to each capacitor in the plurality of capacitors, such that switches are controlled by the controller.

20. The digital wireless transmitter of claim 16 further comprises a plurality of delay circuits, such that phase distortion introduced in the digital transmitter is segmented into multiple segments and each delay circuit in the plurality of delay circuit corresponds to a different segment of phase distortion introduced in the digital transmitter.

* * * * *